United States Patent [19]

Jillie, Jr.

[11] 4,263,603
[45] Apr. 21, 1981

[54] SUBMINIATURE BORE AND CONDUCTOR FORMATION

[75] Inventor: Don W. Jillie, Jr., Arlington, Mass.

[73] Assignee: Sperry Corporation, New York, N.Y.

[21] Appl. No.: 46,396

[22] Filed: Jun. 6, 1979

Related U.S. Application Data

[62] Division of Ser. No. 882,826, Mar. 2, 1978, Pat. No. 4,176,029.

[51] Int. Cl.³ .............................................. H01L 39/22
[52] U.S. Cl. ............................................. 357/5; 357/2; 357/6; 307/277; 307/306; 427/62; 427/63; 204/192 S; 156/643; 156/653
[58] Field of Search ..................... 357/2, 5, 6; 427/62, 427/63, 89; 156/643, 653; 204/192 E; 307/277, 306

[56] References Cited

U.S. PATENT DOCUMENTS

| | | | |
|---|---|---|---|
| 3,599,009 | 8/1971 | Parmentier | 357/6 |
| 4,055,847 | 10/1977 | Fletcher | 357/5 |
| 4,060,427 | 11/1977 | Barile | 156/653 |
| 4,070,501 | 1/1978 | Corbin | 156/653 |
| 4,076,575 | 2/1978 | Chang | 204/192 EC |
| 4,087,314 | 5/1978 | George | 204/192 EC |
| 4,089,766 | 5/1978 | Paal | 204/192 EC |
| 4,096,508 | 6/1978 | Fulton | 357/5 |
| 4,157,555 | 6/1979 | Gray | 357/5 |
| 4,176,029 | 11/1979 | Jillie | 427/62 |
| 4,177,476 | 12/1979 | Kroger et al. | 357/5 |

OTHER PUBLICATIONS

Lum et al., "New Configuration for a Superconducting Weak Link", Journal of Applied Physics, vol. 46, No. 7, Jul. 1975, p. 3216.

*Primary Examiner*—John D. Smith
*Attorney, Agent, or Firm*—Howard P. Terry

[57] ABSTRACT

A process for forming subminiature bores through very thin layers of insulative material disposed between spaced electrical conductors permits the lining of the conductors by a further conductor of microscopic cross section whose dimensions are readily controlled. The method provides reliable reproduction of weak link conductors for employment in applications such as Josephson superconductive devices.

7 Claims, 7 Drawing Figures

SUBMINIATURE BORE AND CONDUCTOR FORMATION

This is a division of Application Ser. No. 882,826, filed: Mar. 2, 1978. Application Ser. No. 822,826 issued Nov. 27, 1979 as U.S. Pat. No. 4,176,029 for a "Subminiature Bore and Conductor Formation."

BACKGROUND OF THE INVENTION

1. Field of the Invention

The invention described herein relates to articles of manufacture and to methods of fabrication of miniature multilayer electronic devices and is more particularly concerned with the preparation of layered configurations for the formation of subminiature electrical conductors between spaced-apart conductive layers of such devices.

2. Description of the Prior Art

Conventional methods generally practiced in the art for fabricating subminiature diameter holes in thin insulating films are generally based upon etching such holes through a photoresist mask; however, the utility of conventional photoresist technique for the purpose is generally limited to dimensions of one micron or greater. Electron beam lithographic techniques offer the possibility of producing masks for generating small holes; however, if chemical (wet) etching is used with such a mask, severe undercutting of the material just below the mask results and there is no fully effective control over the diametric dimension of the bore. If conventional plasma or ion milling etching (dry etching) methods are employed, minimal undercutting is desirably achieved, but typical resist materials are rapidly destroyed when exposed to the reactive gas environments typical of these latter two methods, so that an acceptable product is not reliably generated and is correspondingly expensive. While multiple weak link superconductor devices have been successfully made using standard electron resist techniques to pattern and to etch micron holes in a silicon dioxide layer, there has been demonstrated a need for a more reliable method for generating such holes and submicron conductors passing therethrough in superconductive devices such as described by Harry Kroger in the U.S. patent application Ser. No. 836,452 for a "Multiple Weak Link Squid," filed Sept. 26, 1977 and assigned to Sperry Rand Corporation, that application now abandoned and replaced by patent application Ser. No. 937,014, filed Aug. 25, 1978. A reliable, easily repeatable, and inexpensive process is desired, since the superconductor devices involved have wide possibilities for competitive used in commercial signal processors and computers.

SUMMARY OF THE INVENTION

According to the present invention, a method is provided for forming submicron diameter bores through very thin dual-component layers of insulative material to be interposed between two spaced electrically conductive layers. The method permits the joining of the spaced conductive layers through the hole by a further conductor of submicron diameter whose dimensions may be predictably and accurately controlled. The upper insulative component layer serves as an apertured mask accurately to define the narrow dimension of the bore and, more important, the precise diameter of the connecting weak link itself. While initially serving as a masking pattern, the first component layer remains as a part of the final novel structure, forming an integral part of the insulative structure. The invention affords increased resolution over that obtained by using photolithography alone and overcomes problems associated in prior art methods with the lack of ruggedness of the electron beam resist.

DESCRIPTION OF THE PREFERRED EMBODIMENTS

Figure 1:
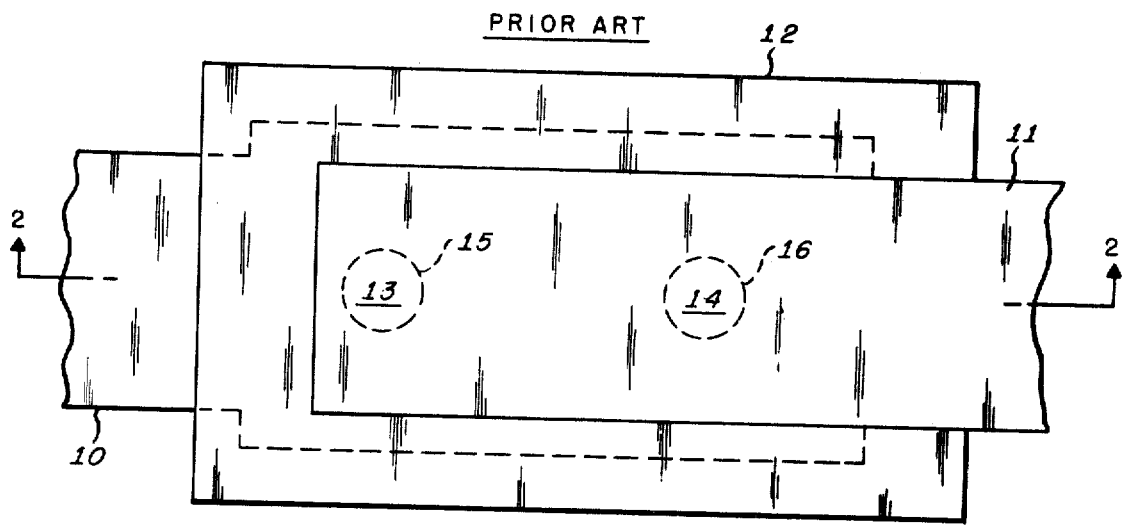
FIG. 1 is a top view of a typical novel superconductive device made according to the present method.

The method and structure involved in the present invention are of particular interest in perfecting to a higher degree the multiple weak link superconducting quantum interference device (SQUID) disclosed in the aforementioned patent application Ser. No. 836,452, primary features of which are illustrated in the respective plan and cross-sectional elevation views of FIGS. 1 and 2. It is seen that the device of the previous patent application comprises a lower layer 10 of superconductive material and a similar superimposed layer 11. Layers 10 and 11 may be formed of any superconductive material; preferably, a refractory metal such as niobium is utilized. Disposed between layers 10 and 11 is an electrically insulative layer 12. One practical embodiment of the device employs an insulative layer 12 of silicon dioxide deposited over the lower superconductor layer 10 to a thickness of approximately 3,000 Angstrom units. It will be appreciated that other conveniently deposited insulator materials of other thicknesses may alternatively be utilized. For example, sputtered silicon or germanium may be used as the cryogenic insulators if the insulating layer is sufficiently thick to prevent electrical conduction. Silicon layers of thickness between 1,000 and 3,000 Angstrom units have been used. Chemically vapor deposited layers of glass may also be used, as well as evaporated layers of silicon monoxide. Preferably, the insulative layer 12 is so constituted as not to support significant Josephson tunneing.

In accordance with the prior invention, two weak links 13 and 14 are included, coupling the lower superconductive layer 10 to the upper superconductive layer 11. The weak links 13 and 14 are formed by very small diameter holes 15 and 16 through insulative layer 12 that are filled with superconductive material when superconductive layer 11 is deposited over insulative layer 12. Holes 15 and 16 may conveniently have diameters of about one micron. It will be appreciated that more than one weak links may be provided through insulative layer 12. It will furthermore be appreciated that the dimension of one micron is exemplary, other dimensions being useable in supporting weak link properties, the main criterion being that the length and width are approximately equal to or less than the conventional superconducting coherence length.

A region 17 is illustrated which is generally bounded as shown in dotted lines by the weak links 13 and 14 and the surfaces of upper and lower superconductive layers 10 and 11 adjacent insulative layer 12. The total effective region is defined in accordance with the depth of penetration of magnetic fields into the superconductive material, which depth of penetration is given by the conventional London penetration depth $\lambda$. Control of the critical current through the SQUID from layer 10 to layer 11 is provided by the magnetic flux that threads region 17.

Figure 2:
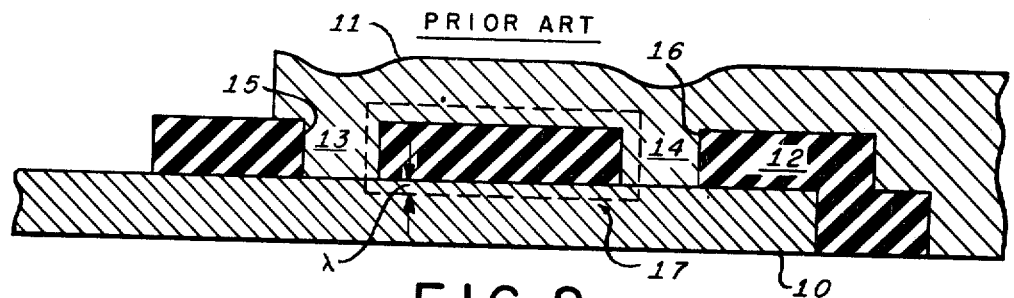
FIG. 2 is a cross-sectional view of a portion of the device of FIG. 1 taken along the line 2—2.
Figure 3:
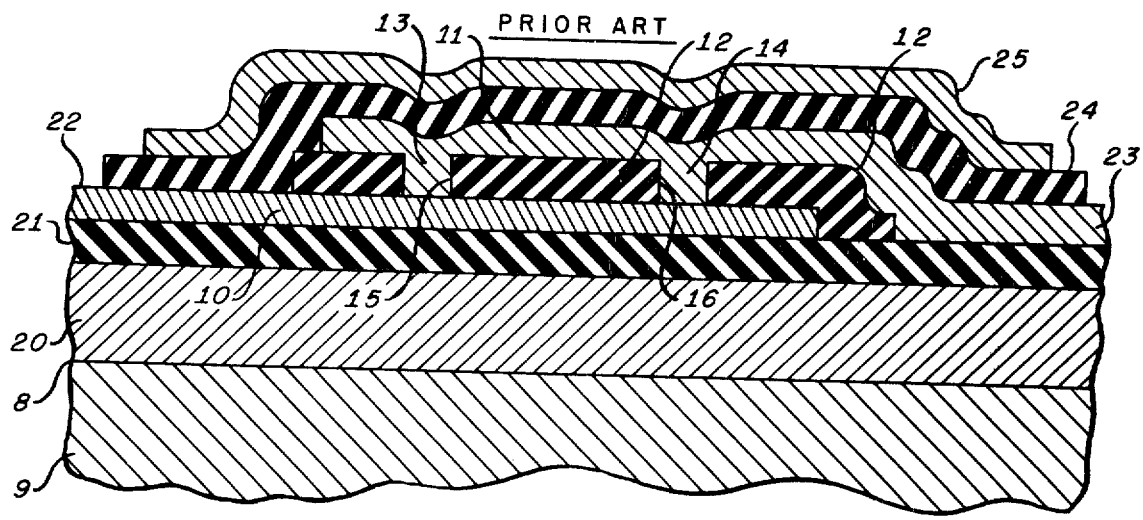
FIG. 3 is a more detailed cross-section view corresponding to FIG. 2.

Referring to FIG. 3, in which like reference numerals indicate like components with respect to FIGS. 1 and 2, a more detailed and complete cross-section of the SQUID of FIGS. 1 and 2 is illustrated. As is known by those skilled in the art, superconductive Josephson logic and memory circuits are generally planar devices with the elements thereof deposited on a superconductive microwave ground plane with the superconductive lines of the device forming microwave strip transmission lines with respect thereto. Accordingly, the lower superconductive layer 10 of FIG. 2 is deposited in FIG. 3 over a superconductive ground plane 20 separated therefrom by the microwave strip transmission line dielectric layer 21. The ground plane 20 is normally deposited over a substrate layer 9 of silicon having an oxidized surface 8. The ground plane 20 may, for example, be a sputtered layer of niobium 1,000 to 5,000 Angstrom units thick deposited on substrate surface 8, with dielectric layer 21 consisting of sputtered silicon dioxide or amorphous silicon deposited on ground plane 20. Superconductive microwave strip extensions 22 and 23 of superconductive layers 10 and 11, respectively, are deposited on dielectric layer 21 and may form part of the superconductive Josephson logic or memory circuit in which the SQUID is utilized as an active swtich, for example.

A further insulator layer 24 deposited over superconductive layer 11 functions to insulate electrically a control line 25 from layer 11. Control line 25 is a superconductive strip disposed parallel to strips 10 and 11 at least in the region of the weak links 13 and 14. In a practical circuit, it is to be understood that control line 25 should not actually run superposed with respect to extensions 22 and 23 so as not to disrupt the microwave transmisson line properties thereof. Current flowing through control line 25 generates a magnetic field resulting in control flux threading region 17 (FIG. 2), thus providing control of the current through weak links 13 and 14. Superconductive ground plane 20 functions to confine all of the magnetic fields produced by currents flowing in microwave strips 10 and 11 to the same side of ground plane 20 as the sources of the fields. Thus, ground plane 20 increases the coupling of the magnetic field generated by control line 25 to the SQUID. The planes containing the respective upper and lower superconductive layers 11 and 10 are substantially parallel to the planes of superconductive ground plane 20 and to control line 25, with weak links 13 and 14 disposed substantially orthogonally with respect thereto.

Figure 4:
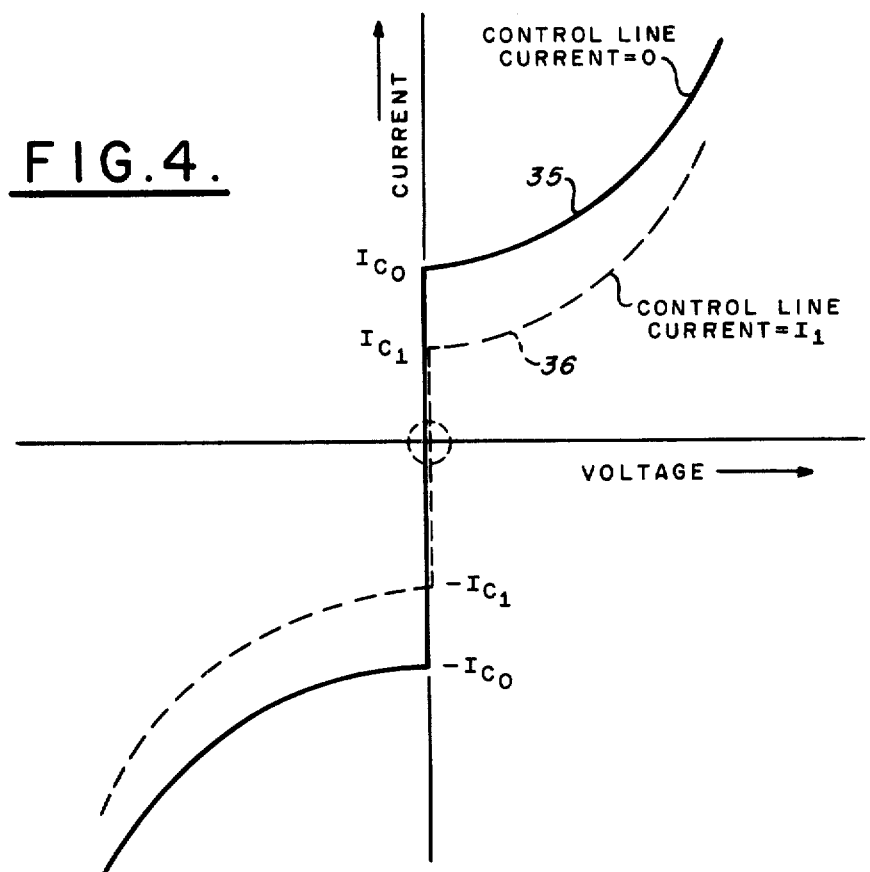
FIG. 4 is a graph of current-voltage characteristics of the device of FIGS. 1, 2, and 3.

In operation, current flowing between lines 22 and 23 through the device of FIG. 3 is controlled by the magnetic field through the SQUID generated by current passed through control line 25. FIG. 4 illustrates the current-voltage characteristics of the SQUID when the control line current is equal to zero (curve 35) and when the control line current is equal to $I_1$ (curve 36). The current voltage characteristics of the SQUID may be derived by forcing a variable current between leads 22 and 23 and measuring the voltage therebetween for various values of direct current applied to control line 25. These characteristics may conveniently be displayed, for example, on an oscilloscope by applying an alternating current to the SQUID with a variable direct current applied to control line 25. The critical current $I_c$ for zero control line current is $I_{C0}$, whereas the critical current for the control line current $I_1$ is $I_{C1}$. Thus, when the external magnetic field applied to the SQUID is zero, the value of the current through the SQUID is the critical current $I_{C0}$. When a current $I_1$ is passed through control line 25, the value of the current through the SQUID is the critical current $I_{C1}$.

It will be appreciated that the device of FIG. 3 exhibits maximum sensitivity of the critical current through the SQUID to the control current through line 25. The plane which contains weak links 13 and 14 is substantially perpendicular to the planes which contain ground plane 20 as well as upper and lower superconductive layers 10 and 11 and control line 25. Thus, the region 17 bounded by weak links 13 and 14 and the planes coinciding with the London penetration depth $\lambda$ inside upper and lower superconductors 10 and 11 will have a maximum projection against the direction of the magnetic field generated by control current flowing through line 25. The magnetic flux linking the SQUID for a given control line current will therefore be maximum for this geometric arrangement and, since the critical current depends upon magnetic flux rather than the magnetic field itself, maximum sensitivity to the control results. Additionally, the control sensitivity is maximum when the control current through line 25 flows in the direction from 13 to 14 or visa versa, rather than at an angle with respect to the plane of the drawing.

It is advantageous to maintain a high ratio of the maximum value of the critical current to the minimum value of critical current that can be supported by the SQUID. This result is achieved by making the individual critical currents of the weak links 13 and 14 as equal as possible, which result is, in turn, accomplished by making the individual weak-links as precisely alike as possible. Thus, an important desideratum of the SQUID fabrication procedure according to the present invention is to obtain the same width and height of the weak links with respect to each other. Methods of obtaining almost identical weak links are known in the arts of depositing insulator films of substantially uniform thickness and of producing holes therein of relatively uniform cross-section by electron beam lithography as taught in the aforementioned patent application. However, the present invention extends the ability of the practitioner even more precisely to control the dimension of weak links such as weak links 13 and 14.

Referring again to FIG. 3, the insulative layers 21 and 24 provide a function different from that of the insulative layer 12. Insulative layer 12 defines weak links 13 and 14 of the active device and, as explained, the thickness of the layer 12 affects the sensitivity of the device to control by the applied magnetic field. The thickness of insulative layer 12, as well as its dielectric constant, determines the lumped element equivalent capacitance of the device. The insulative layer 21 is the microwave strip transmission line dielectric which provides electrical isolation between ground plane 20 of the microwave circuit and strip transmission lines 22 and 23, which strip lines are extensions of upper and lower superconductors 10 and 11, respectively, of the active device. The dielectric layer 21 also insulates the extensions of control line 25 from ground plane 20. It is appreciated that control line 25 cannot reside directly over lines 22 and 23 except in the vicinity of the active SQUID device. The widths of lines 22, 23, 25, together with the thickness and dielectric constant of insulator layer 21, determine the characteristic or surge impedance of the microwave strip transmission lines.

The method of fabrication of the superconductive device of FIG. 3 may be initiated starting with steps generally similar to those initial steps described in the aforementioned patent application Ser. No. 836,452, but before the problem of providing the precisely weak links 13 and 14 is reached, other improved and novel steps are introduced in order to perfect the weak link configurations. The initial steps of fabrication will first be discussed.

Construction is started by selecting a clear silicon wafer 9 on which the ground plane niobium layer 20, the silicon dioxide insulative layer 21, and the lower niobium layer 10 are successively affixed. The several layers may be generated successively within an evacuated radio frequency sputtering vessel of conventional nature. Initial pressure is about $20^{-7}$ milli-Torr, the system being back-filled with argon at 20 milli-Torr. All of the sputtering cathodes are cleaned of absorbed gases and other contaminants by pre-sputtering at low power (100 watts for 5 minutes), as is usual in the sputtering art. The niobium layer 20 is formed to a depth of about 4,000 Angstrom units on silicon wafer 9 by sputtering for 20 minutes at 500 watts, the silicon dioxide dielectric layer 21 to a depth of about 4,000 Angstrom units by sputtering for 30 minutes at 200 watts and, finally, the niobium layer 10 to a depth of about 3,000 Angstrom units by sputtering for 15 minutes at 500 watts. During these processes, substrate 9 is water cooled so that the temperature rise of the semiconductor materials due to the sputtering process is adequately controlled. It will be understood that these parametric values are typical of a particular sputtering system and will vary from system to system depending upon the system design.

The niobium lower superconductor layer 10 is next treated by standard photoresistive procedures and by wet chemical, dry chemical, or sputter etching to pattern layer 10 to form the illustrated island pattern and its extension 22. It is preferred according to the present invention that the island and extension 22 are patterned using an available positive photoresist material and a standard contact mask with conventional photoresist procedures. After the photoresist is developed, the niobium layer 10 is selectively etched away preferably within a conventional plasma etching-stripping machine such as that generally illustrated in the Jacobs U.S. Pat. No. 3,795,557. Such machines generate a relatively high pressure reactive plasma in oxygen and selected halocarbon gases for etching various metals with minimum removal of the developed organic photoresist mask and of exposed silicon dioxide. According to the present method, the lower superconductor layer 10 is etched at about a 100 watt level in about two minutes. Since the silicon dioxide insulative layer 21 does not readily etch, it may act as a stop for the etching process.

Next, the developed photoresist is stripped from the niobium layer 10 by using a conventional organic chemical resist stripper or, preferably, by performing the operation in the same plasma machine, but with oxygen fully replacing the etchant halocarbon gas. Stripping may be accomplished at pressures of oxygen of about 5 Torr at power levels of 400 to 500 watts for ten to fifteen minutes duration, the process removing all photoresist without significantly affecting the silicon dioxide or patterned niobium. The several described operations are performed in the best known manner for providing a smooth, uniform, and flat upper surface for the niobium lower conductor 10 to aid in arriving at the desired dimensional preciseness of the structure remaining to be fabricated.

Figure 5:
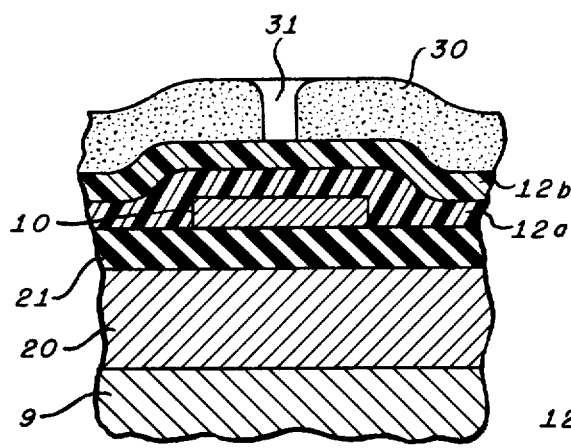
FIGS. 5, 6, and 7 are cross-section views of portions of FIG. 3 showing steps in the process of its manufacture.

According to the novel method, the insulating layer 12 of FIG. 3 is next formed; more particularly, it is formed by generating the two component layers 12a and 12b shown in more detail in FIG. 5 which is taken at right angles to the plane of the drawing FIG. 3. Layer 12a is formed to a thickness of 1,000 Angstroms by sputtering silicon dioxide for 15 minutes at a 200 watt level, after which the amorphous insulating layer 12b is formed of sputtered silicon with a depth of 1,000 Angstroms in 5 minutes at a 500 watt level. Well known sputtering procedures may be used to form layers 12a and 12b. As in all sputtering steps, the substrate 9 is affixed in close thermal contact to a water-cooled platen over which the sputtering process is maintained in order to prevent damage due to over-heating.

The surface of silicon layer 12b is next coated with an electron beam resist layer 30 (FIG. 5) formed of a material conventionally used for the purpose, such as polymethyl methacrylate. Conventional spin-coating is preferred so as to obtain a uniform film 30 of constant thickness over insulator layer 12b when the usual baking step is completed. After baking, the surface of the methacrylate layer above the future location of the weak link connection is exposed to a finely-focussed electron beam. The electron beam resist layer 30 is then developed, using the conventional procedure, so that the small diameter region exposed to the electrons is removed. The structure shown in FIG. 5 is thus completed, the major extent of the hole 31 having a regular diameter of 0.5 microns diameter; however, such holes having very regular diameters of 0.2 microns are readily demonstrated.

Figure 6:
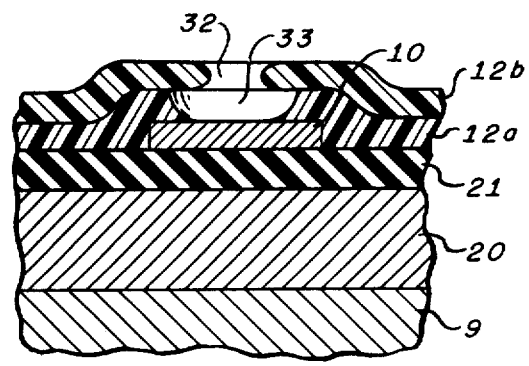

Next, to form the structure as it is shown in FIG. 6, the configuration of FIG. 5 is introduced into a conventional plasma etching machine such as used in a previous step with a reactive gas of the type employing oxygen and a selected halocarbon gas or gases such as are sold as the proprietary gas DE-100 by the LFE Corporation, Waltham, Mass. In this step, the silicon surface of layer 12b exposed by hole 31 is plasma etched by a reactive electrically energized gaseous ion etching process for about 30 seconds at a gas pressure of 3 Torr and at a 100 watt power level. The reactive gas etches the silicon layer 12b, having comparatively little effect on the silica layer 12a when it reaches it, or on the methacrylate resist layer 30. While there is some undercutting of the silicon layer 12b in the plasma etching step with respect to the diameter of hole 31 in the resist, the undercutting is not severe and is far less than when similar etching is attempted using wet chemical methods. While known photoresist materials may be used in place of the methacrylate, the latter is sufficiently rugged, lasting long enough under plasma bombardment to etch the desired hole through the silicon layer 12b. Typically, a 0.5 micron hole 31 results in a 0.7 micron average diameter hole 32 through silicon layer 12b, silica layer 12a being substantially untouched.

Next, the reactive gas is swept from the plasma chamber and, using oxygen alone, the remaining resist is stripped in about four minutes by operation at about a 350 watt level. The device is then removed from the plasma chamber and is etched in buffered hydrofluoric acid for about one minute or for a time sufficient to etch through the silica layer 12a primarily where it has been uncovered by the hole 32 in silicon layer 12b. Hydroflouric acid is selected because it does not etch the niobium layer 10 or the silica layer 12a to any significant extent; thus the hole 32 retains its shape and the niobium layer 10 is not attacked. It is to be observed that the silica layer 12a is undercut by the acid etch, but this is not of material consequence. The silicon layer 12b and the hole 32 through it remain intact and are not affected by the acid etch. The silicon layer 12b is to remain as a permanent insulating part of the structure, but also serves an immediate purpose as a mask for the next step to be practiced according to the novel method.

Figure 7:
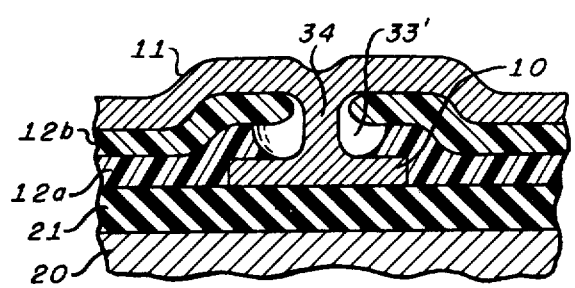

In this next step, the upper niobium layer 11 is formed over the silicon layer 12b, along with the weak link connector 34 passing through holes 32, 33 and making good electrical contact with the upper surface of the lower niobium layer 10. The structure shown in FIG. 6 is etched by sputtering at about 100 watts for three minutes to clean all exposed surfaces, including the exposed upper surface of niobium layer 10. This is followed by a 5 minute niobium pre-sputter episode at about 100 watts and then by about 30 minutes of sputtering niobium at about a 500 watt level. The resulting niobium layer 11 extends as shown in FIG. 7 across hole 32 and is about 6,000 Angstroms thick; it extends down into holes 32, 33 so as to form a circular cylindric weak link connector 34 making good contact with niobium layer 10. While an annular empty space 33' at layer 12a remains surrounding weak link 34, the silicon layer 12b has served as a very effective mask and the hole 32 within it has served to ensure that weak link 34 is of uniform diameter and of repeatable dimensions. Although the described embodiments of the invention are explained in terms of the one pair of weak links 13 and 14, it will be appreciated that more than two such weak links may be utilized in practicing the invention. For example, weak links in excess of two may be beneficially utilized to alter the dependence of critical current upon control line current.

In addition to forming the niobium layer 11 in the vicinity of weak link 34, the line extensions 23 of FIG. 3 are formed simultaneously. To complete the device as shown in FIG. 3, any unwanted portions of the niobium layer 11 are first removed by photoresistive and plasma etching procedures such as used to pattern niobium layer 10. The insulator layer 24 is formed by sputtering 3,000 Angstrom units of silicon dioxide or by evaporating silicon monoxide. Any unwanted areas of the insulator layer 24 are removed by standard photoresistive and etching procedures. It is required that the cross-over insulator layer 24 exist only between niobium layers 25 and 11 or 23 and between layers 25 and 10 or 22. The final step involves sputtering the upper niobium layer forming the control line 25. The layer deposited in this step can also function to form any required interconnections between layers 22 and 23 with respect to portions of associated circuits whose exact nature must be dictated by the requirements of the system in which the device of FIG. 3 is to be employed and which therefore are not necessarily concerned with the present invention.

It will be understood by those skilled in the art that minor liberties have been taken with proportions and dimensions in preparing the several figures for the purpose of making the drawings readily understandable. However, it can be reasonably stated, for the purpose of illustrating in a general way the scale of the figures, that they represent enlargements of roughly 20,000 times.

As employed according to the present invention, plasma etching is a known reactive process in which fluorine and oxygen radicals appear to interact chemically with materials at a surface when etching is accomplished. It will be understood that conventional ion beam etching, including ion beam or sputter etching methods using reactive gases such as oxygen and flourocarbons, may be successfully substituted in any of the foregoing steps where plasma etching has been prescribed.

According to the invention, it is seen that a novel method is provided for forming microscopic submicron diameter bores in thin insulative films such as employed, for example, in superconductive and other current control devices. The method permits the formation of holes through insulative layers of thickness relatively greater than the diameter of the bore. The novel method permits the successful formation of such very small holes in dual component layers by selecting the components of distinct materials, one component layer being relatively thick while the other is thinner. The upper or thin layer is patterned by use of plasma or ion beam (dry) etching through an electron-beam generated hole in a temporary mask. The insulative material of the lower component layer acts as a stop for the dry etching process, but is capable of being chemically (wet) etched. The upper component layer is readily dry etched, but is resistant to chemical (wet) etching. The upper component layer serves as a permanent mask to define the narrow dimension of the bore and, more important, the diameter of a connecting link subsequently formed within the bore. While initially serving as a masking pattern, the first component layer remains in the structure to form an integral part of the insulative structure.

While the invention has been described in its preferred embodiments, it is to be understood that the words which have been used are words of description rather than of limitation and that changes may be made within the purview of the appended claims without departing from the true scope and spirit of the invention in its broader aspects.

What is claimed is:

1. A current controlling device comprising:
   first and second electrically super-conductive layers, one superposed with respect to the other, and
   first and second electrically insulative permanent layers interposed between said first and second electrically super-conductive layers,
      said electrically insulative permanent layers having at least one hole therethrough with a first electrical linking super-conductor disposed in current carrying relation between said first and second electrically super-conductive layers,
   said first electrically insulative permanent layer being composed of a material resistant to etching by a first etching process but susceptible of etching by a second etching process to form a first portion of said hole,
   said second electrically insulative permanent layer being composed of a material susceptible of etching by said first etching process to form a second portion of said hole but resistant to said second etching process, and said first electrically super-conducting layer and said first electrical linking super-conductor being formed integrally of the same material.

2. A current controlling device as described in claim 1 wherein:

said second etching process is a wet acid etching process, and said first etching process is a reactive electrically energized gaseous ion etching process.

3. A current controlling device as described in claim 2 wherein said first electrically insulative permanent layer is silicon dioxide.

4. A current controlling device as described in claim 3 wherein said second electrically insulative permanent layer is silicon.

5. A current controlling device as described in claim 4 wherein said first and second electrically super conductive layers and said electrical linking super conductor consist of a superconductive niobium.

6. A current controlling device as described in claim 5 wherein said electrically insulative permanent layers have at least a second hole therethrough spaced apart from said first hole with a second electrical linking superconductor composed of niobium and disposed in current carrying relation between said first and second conducting layers.

7. A superconductive control device incorporating the current controlling device of claim 6 and further including control line means proximate said first and second electrically conductive layers and electrically insulated therefrom for providing a control magnetic field at the region of said first and second linking superconductors for controlling current flow therethrough.

* * * * *